United States Patent [19]

Frieling et al.

[11] Patent Number: 4,572,974
[45] Date of Patent: Feb. 25, 1986

[54] SIGNAL-LEVEL CONVERTER

[75] Inventors: Focko Frieling, Munich; Ewald Michael, Haar, both of Fed. Rep. of Germany

[73] Assignee: Siemens Aktiengesellschaft, Berlin and Munich, Fed. Rep. of Germany

[21] Appl. No.: 512,210

[22] Filed: Jul. 8, 1983

[30] Foreign Application Priority Data

Jul. 9, 1982 [DE] Fed. Rep. of Germany ....... 3225803

[51] Int. Cl.[4] .................. H03K 19/094; H03K 3/023; H03K 3/356; G11C 8/00
[52] U.S. Cl. .................................... 307/475; 307/269; 307/270; 307/279; 307/362
[58] Field of Search ............... 307/475, 443, 449, 463, 307/264, 270, 279, 269, 362; 365/189, 230

[56] References Cited

U.S. PATENT DOCUMENTS

| | | | |
|---|---|---|---|
| 4,077,031 | 2/1978 | Kitagawa et al. | 307/475 X |
| 4,130,768 | 12/1978 | Bula et al. | 307/475 X |
| 4,396,845 | 8/1983 | Nakano | 307/475 |
| 4,417,163 | 11/1983 | Otsuki et al. | 307/475 |
| 4,441,039 | 4/1984 | Schuster | 307/475 |

FOREIGN PATENT DOCUMENTS

| | | | |
|---|---|---|---|
| 2818350 | 10/1979 | Fed. Rep. of Germany | 307/475 |
| 0113192 | 9/1980 | Japan | 307/475 |
| 0003429 | 1/1982 | Japan | 307/475 |

OTHER PUBLICATIONS

IEEE Journal of Solid-State Circuits, vol. SC-15, No. 3 (10/1980), pp. 843-844.
Furman, "Address Buffer True/Complement Generator", *IBM Tech. Disc. Bull.*; vol. 18, No. 11, pp. 3597-3598; 4/1976.
Lee et al., "A 80ns 5V-Only Dynamic RAM"; ISSCC 79; Session XII; Dynamic Memories; Digest of Technical Papers 2 pps.; 2/15/1979.

*Primary Examiner*—Larry N. Anagnos
*Attorney, Agent, or Firm*—Herbert L. Lerner; Laurence A. Greenberg

[57] ABSTRACT

A signal-level converter for controlling digital MOS circuits, particularly an address-buffer circuit for dynamic MOS memories, is designed in integrable form in MOS technology and is addressed on one hand by a first supply potential and a second supply potential connected as the reference potential, and on the other hand, at a signal input by the digital control signal to be processed, and furthermore includes cross-coupled field-effect transistor pairs as well as two output terminals carrying signals inverted relative to each other for controlling the digital circuit.

6 Claims, 5 Drawing Figures

SIGNAL-LEVEL CONVERTER

The invention relates to a signal-level converter for controlling digital MOS-circuits, particularly an address-buffer circuit for dynamic MOS-memories, in which the signal-level converter which is integrable and likewise constructed in MOS-technology, is addressed on one hand by a first supply potential and a second supply potential connected as the reference potential, and on the other hand is addressed at a signal input by the digital control signal to be processed, and including cross-coupled field-effect transistor pairs as well as two output terminals carrying mutually inverted signals, for the control of a digital circuit.

As is well known, signal-level converters are frequently used in digital integrated semiconductor circuits if a digital signal furnished by a digital semiconductor circuit made according to a given first type of technology is used for controlling a second digital circuit made according to a second type of technology, therefore making it necessary to match the levels of the digital signals to be controlled to the pulses required for driving the second circuit. Signal-level converters are particularly used as address buffers for MOS-write-read memories, where the level of the addressing signal made available from an external control source, such as by a circuit in ECL-technology, must be changed to the level required for the MOS-semiconductor memory. In general, the level conversion is accomplished by controlling control pulses. Care must be taken in this case to see to it that in further digital processes, such as in the case of the address buffer, the word-line selection is only started after the level conversion is completed, because otherwise a signal falsification, such as misaddressing in the case indicated, would be the consequence. However, since on the other hand it is of interest for known reasons to ensure that the addressing is completed as fast as possible, the same applies also to the operation of a level converter.

A circuit diagram of an address buffer integrated in MOS-technology is shown in "IEEE-Journal of Solid-State Circuits", Vol. SC-15, No. 5 (Oct. 1980) on page 843 (see FIG. 9). However, it is seen in such a case that the circuit principle used in the conventional address buffer, which likewise corresponds to the above-given description, furnishes the secondary signals required for controlling the part of the memory following the address buffer (such as an internal decoder) only after a relatively long delay, because a relatively large number of pulses are required for the operation of the circuit.

It has been recognized, according to the invention, that it is entirely possible in a suitable embodiment of such an address buffer, to reduce the minimum response time by 5 to 6 ns, because such an embodiment requires one pulse type less than the known circuit for proper operation, and therefore the response delay due to the generation of that pulse type is eliminated.

It is accordingly an object of the invention to provide a signal-level converter which overcomes the hereinafore-mentioned short-comings of the heretofore-known devices of this general type, which therefore leads to a noticeable reduction of the minimum delay interval as compared to prior art address-level converters, and which only requires simple MOS field-effect transistors of the same channel type, especially self-blocking MOS-FETs, for construction of the device.

With the foregoing and other objects in view there is provided, in accordance with the invention, a signal-level converter circuit for controlling digital MOS circuits, especially an address-buffer circuit for dynamic MOS memories, constructed in integrable form in MOS technology, comprising a first supply potential source, a second supply potential source delivering a reference potential, an auxiliary potential source delivering an auxiliary potential lying between the first and second supply potentials, a common clock generator having first, second and third outputs delivering first, second and third auxiliary signals, respectively, first and second converter signal outputs carrying signals being inverted relative to each other for controlling the digital circuit, a signal input for receiving a digital control signal to be processed, and first through twenty-first field-effect transistors each having a gate terminal and current-carrying terminals in the form of a source terminal and a drain terminal defining a source-drain path, the signal input being connected to the gate terminal of the first transistor, the source terminals of the first and second transistors being connected together to the drain terminal of the third transistor, the source terminal of the third transistor being connected to the first output of the clock generator, the drain terminal of the first transistor being connected through the fourth transistor to one of the current-carrying terminals of the sixth transistor, the drain terminal of the second transistor being connected through the fifth transistor to the other of the current-carrying terminals of the sixth transistor, the one current-carrying terminal of the sixth transistor also being connected to the source terminal of the seventh transistor and to the gate terminal of the eighth transistor, the other current-carrying terminal of the sixth transistor also being connected to the source terminal of the eighth transistor and to the gate terminal of the seventh transistor, the ninth and tenth transistors being connected together in series between the drain terminal of the seventh transistor and the drain terminal of the eighth transistor, the source-drain paths of the eleventh and twelfth transistors being connected together in parallel between the source terminal of the seventh transistor and the first supply potential source, the source-drain paths of the thirteenth and fourteenth transistors being connected together in parallel between the source terminal of the eighth transistor and the first supply potential source, the gate terminal of the eleventh transistor being connected to the drain terminal of the seventh transistor, the gate terminal of the thirteenth transistor being connected to the drain terminal of the eighth transistor, the ninth and tenth series-connected transistors defining a circuit node therebetween connected through the fifteenth transistor to the first supply potential source, the gate terminals of the fifteenth, sixth, ninth, tenth, twelfth and fourteenth transistors being jointly connected to the second output of the clock generator, the gate terminals of the second, third, fourth and fifth transistors being jointly connected to the auxiliary potential source, the sixteenth and seventeenth transistors having cross connected drain and gate terminals forming a first RS flip-flop, the eighteenth and nineteenth transistors having cross connected drain and gate terminals forming a second RS flip-flop, the source terminals of the sixteenth, seventeenth, eighteenth and nineteenth transistors being connected to the second supply potential source, the drain terminal of the sixteenth transistor being connected to the source terminal of the seventh transistor, the drain terminal of the eighteenth transistor being connected to the source terminal of the eighth transistor, the drain terminal of the seventeenth transistor being connected to the source terminal of the twentieth transistor, the drain terminal of the nineteenth transistor being connected to the source terminal of the twenty-first transistor, the gate terminal of the twentieth transistor being connected to the drain terminal of the eighth transistor, the gate terminal of the twenty-first transistor being connected to the drain terminal of the seventh transistor, the drain terminals of the twentieth and twenty-first transistors being connected to the third output of the clock generator, the auxiliary signals delivered by the clock generator being matched to each other in such a manner that the effective level of the first and second auxiliary signals are given substantially or practically simultaneously and the effective level of the second auxiliary signal is set appreciably or substantially higher than the effective level of the first auxiliary signal, the third auxiliary signal being at substantially the same effective level as the second auxiliary signal and being reached or set-in immediately upon the occurence of decay of the first auxiliary signal, the first, second and third auxiliary signals having a zero state given by the reference potential delivered by the second supply potential source, the source terminal of the twentieth transistor being connected to the first signal-level converter signal output, and the source terminal of the twenty-first transistor being connected to the second signal-level converter signal output.

In accordance with another feature of the invention, there is provided a signal-level converter or address buffer, including another field-effect transistor having a gate terminal connected to the first converter signal output, a drain terminal connected to the first supply potential source, and a source terminal, a further field-effect transistor having a gate terminal connected to the second converter signal output, a drain terminal connected to the first supply potential source, and a source terminal, a third RS flip-flop being connected to the second supply potential source and having one output connected to the source terminal of the other field-effect transistor and another output connected to the source terminal of the further field-effect transistor, a first address buffer signal output connected to the source terminal of the other field-effect transistor, a second address buffer signal output connected to the source terminal of the further field-effect transistor, two discharge transistors each being connected between a respective one of the outputs of the third RS flip-flop and the second supply potential source, the discharge transistors having gate terminals, and a fourth auxiliary signal output connected to the gate terminals of the discharge transistors.

In accordance with a concomitant feature of the invention, there is provided a signal-level converter or address buffer, wherein all of the field-effect transistors are of the same type, especially the n-channel enhancement type.

Other features which are considered as characteristic for the invention are set forth in the appended claims.

Although the invention is illustrated and described herein as embodied in a signal-level converter, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which.

Figure 1:
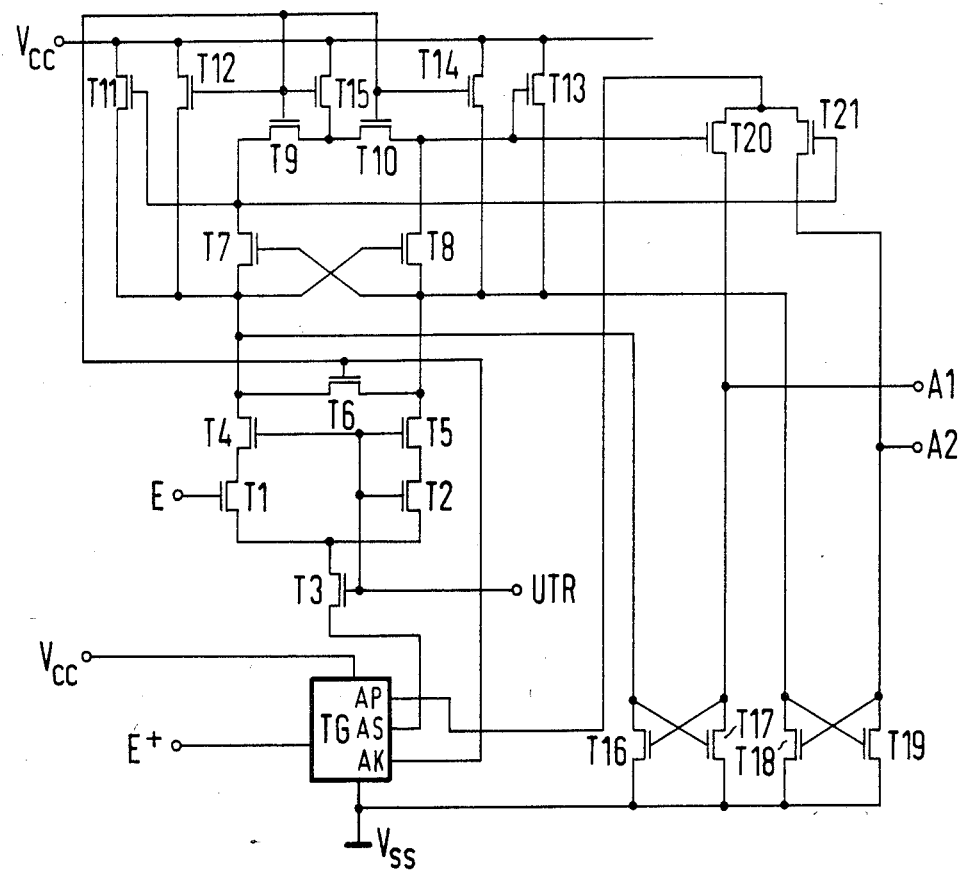
FIG. 1 is a schematic circuit diagram of a circuit in single-channel MOS-technology with self-blocking MOS-FETs according to the invention.

Referring now to the figures of the drawing in detail and first particularly in FIG. 1 thereof, there is seen a signal input E which is to be addressed by control signals that are to be converted according to level, the signal E being fed to the gate of a first field-effect transistor T1. The source terminal of this first field-effect transistor T1 is connected to the source terminal of a second, identical field-effect transistor T2 and is further connected to the drain of a third field-effect transistor T3. The source of the third field-effect transistor T3 is addressed by a clock generator TG with pulses forming a first auxiliary signal AS, while the gate of the third field-effect transistor T3 is addressed by an auxiliary potential UTR which is derived, for instance, by means of a voltage divider R1, R2 from two supply potentials $V_{cc}$ and $V_{ss}$, as shown in detail in FIG. 4. The first supply potential is designated, as customary, with reference symbol $V_{cc}$ and the second supply potential, connected as reference potential (ground) is designated with reference symbol $V_{ss}$.

The drain of the first field-effect transistor T1 is connected to the source of a fourth field-effect transistor T4, and the drain of the second field-effect transistor T2 is connected to the source of a fifth field-effect transistor T5. The same auxiliary potential UTR which is provided for controlling the gate of the third field-effect transistor T3, also serves for addressing the gates of the second field-effect transistor T2, the fourth field-effect transistor T4 as well as the fifth field-effect transistor T5.

The drain of the fourth field-effect transistor T4 is connected to the drain of the fifth field-effect transistor T5 through the current-carrying path of a sixth field-effect transistor T6, the gate of which is controlled by a second auxiliary signal AK. In addition, the drain of the fourth field-effect transistor T4 leads to a circuit node, which is formed by the source terminal of a seventh field-effect transistor T7, the gate of an eighth field-effect transistor T8, the source terminal of an eleventh field-effect transistor T11 as well as the source terminal of a twelfth field-effect transistor T12. Similarly, the drain of the fifth field-effect transistor T5 leads to a circuit node which is formed by the source terminal of the eighth field-effect transistor T8, the gate of the seventh field-effect transistor T7 as well as the source terminal of a thirteenth field-effect transistor T13 and a fourteenth field-effect transistor T14.

It should be mentioned that the circuit nodes are furthermore connected to a first RS flip-flop and a second RS flip-flop, mentioned above, in a manner yet to be described.

The drain of the seventh field-effect transistor T7 and the drain of the eighth field-effect transistor T8 are connected together through the source-drain paths of a ninth field-effect transistor T9 and a tenth field-effect transistor T10 which are connected together in series. The gates of the ninth and tenth transistors T9, T10 are controlled, as is the transistor T6, by the second auxiliary signal AK. A circuit point located between the ninth field-effect transistor T9 and the tenth field-effect transistor T10, is connected through a fifteenth field-effect transistor T15 to the first supply potential $V_{cc}$. In addition, the drains of the eleventh field-effect transistor T11, the twelfth field-effect transistor T12, the thirteenth field-effect transistor T13 as well as the fourteenth field-effect transistor T14 are connected to the first supply potential $V_{cc}$.

It is further noted that the gate of the eleventh field-effect transistor T11 is connected to the drain of the seventh field-effect transistor T7, and the gate of the thirteenth field-effect transistor T13 is connected to the drain of the eighth field-effect transistor T8. In contrast thereto, the gates of the twelfth field-effect transistor T12, the fourteenth field-effect transistor T14 and the fifteenth field-effect transistor T15 are connected to the second auxiliary signal AK.

As already indicated, the source terminal of the seventh field-effect transistor T7, besides being connected to the transistors T4, T6, T8, T11 and T12 as mentioned above, is connected to the drain of a sixteenth field-effect transistor T16 and to the gate of a seventeenth field-effect transistor T17. Likewise, besides the already mentioned connections to the transistors T5, T6, T13 and T14, the source terminal of the eighth field-effect transistor T8 is also connected to the drain of an eighteenth field-effect transistor T18 and to the gate of a nineteenth field-effect transistor T19.

The last introduced field-effect transistors T16 to T19 are tied with their source terminals to the second reference potential $V_{ss}$. The two transistors T16 and T17 therefore form a first RS flip-flop and the two transistors T18 and T19 form a second RS flip-flop.

Furthermore, the drain of the seventh field-effect transistor T7 as well as the drain of the eighth field-effect transistor T8 each control the gate of a respective further field-effect transistor T20 and T21. The drain terminals of the transistors T20, T21 are acted upon jointly by a third auxiliary signal AP mentioned above. Furthermore, the gate of the twentieth field-effect transistor T20 is connected to the drain of the eighth field-effect transistor T8 and the source of the transistor T20 is connected to the gate of the sixteenth field-effect transistor T16 and to the drain of the seventeenth field-effect transistor T17. Similarly, the gate of the twentyfirst field-effect transistor T21 is controlled by means of the drain of the seventh field-effect transistor T7, and the source of the transistor T21 is connected in a conducting manner to the drain of the nineteenth field-effect transistor T19 and to the gate of the eighteenth field-effect transistor T18.

Figure 4:
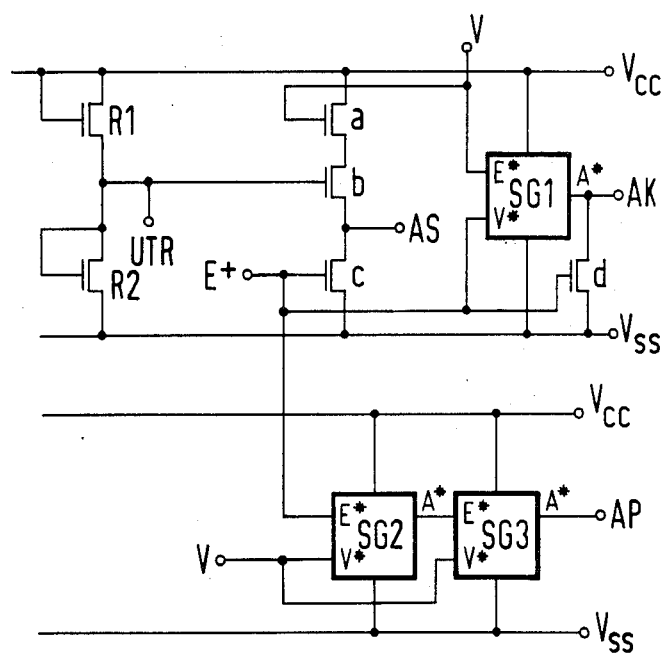
FIG. 4 is a circuit diagram of an embodiment for the clock generator which serves for generating the three auxiliary signals.

For generating the auxiliary potential UTR which was already mentioned in connection with the field-effect transistors T2, T3, T4 and T5, a voltage divider R1, R2 can be used, as already mentioned and shown in connection with the clock generator TG, shown in detail in FIG. 4. The voltage divider R1, R2 is acted upon on one side by the first supply potential $V_{cc}$ and on the other side by the second supply potential $V_{ss}$ which is provided as the reference potential for the entire circuit. Preferably, the auxiliary potential UTR, which is between the two supply potentials, is set in such a way that it is in the middle between the two potential values defining the logic levels.

The source terminal of the twentieth field-effect transistor T20 as well as the source terminal of the twentyfirst field-effect transistor T21, or in other words the output of the RS flip-flops formed by the transistors T16 and T17 and T18 and T19, connected to the respective source terminal, each form a respective signal output A1 and A2 of the signal-level converter.

Figure 2:
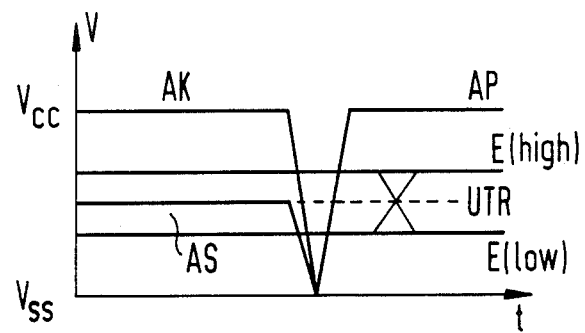
FIG. 2 is a timing diagram corresponding to the circuit of FIG. 1.

The waveform of the first and second auxiliary signals AS and AK as well as the waveform of the third auxiliary signal AP, are shown in FIG. 2. These likewise correspond to the description of the invention given above.

Figure 3:
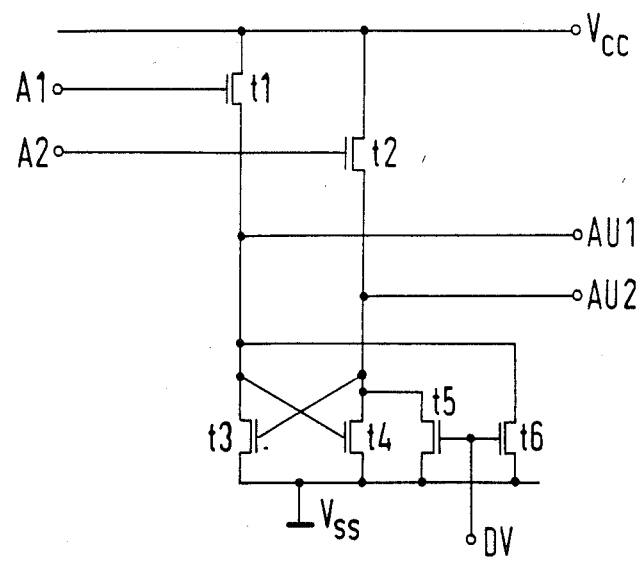
FIG. 3 is a circuit diagram of a supplementary circuit for the signal output of the signal-level converter according to the invention, which forms the connection between the above-defined circuit and the signal input of the circuit portion to be driven by the signal-level converter, and is advantageously monolithically combined with the signal-level converter according to the invention.

FIG. 3 shows a supplemental part which is used to advantage, for instance, if the system shown in FIG. 1 according to the invention, is to be used as an address buffer circuit for a dynamic MOS-memory. According to this supplemental circuit, the output A1, i.e. the source of the twentieth field-effect transistor T20 (or the drain of the transistor T17 and the gate of the transistor T16, and therefore the RS flip-flop set by the source of the seventh field-effect transistor T7) is provided for controlling the gate of a first field-effect transistor t1 of the supplemental circuit shown in FIG. 3. The other output A2 of the circuit shown in FIG. 1 (i.e., the source of the twentyfirst field-effect transistor T21 and therefore, the output of the RS flip-flop formed by the transistors T18 and T19) serves for controlling the gate of a second field-effect transistor t2 of the circuit shown in FIG. 3. The drains of the first transistor t1 as well as the second transistor t2, are connected to the first supply potential $V_{cc}$. The source of the first field-effect transistor t1 is connected on one hand to the drain of a third field-effect transistor t3 and to the gate of a fourth field-effect transistor t4 in the circuit. On the other hand, the source of the second field-effect transistor t2 of the circuit is connected to the gate of the third field-effect transistor t3 as well as to the drain of the fourth field-effect transistor t4. Both the third and fourth field-effect transistors t3 and t4 are conneceted through their source electrodes to the reference potential $V_{ss}$. Both field-effect transistors t3 and t4 therefore likewise form an RS flip-flop. The source-drain paths of the two field-effect transistors t3 and t4 forming the flip-flop are each shunted by the source-drain path of a respective further field-effect transistor t5 and t6, which are controlled by a common fourth auxiliary signal DV. Two signal outputs AU1 and AU2 are provided by the source terminals of the first transistor t1 and the second transistor t2, respectively.

In order to obtain a maximum reaction speed at the input signal to be applied to the signal input E of the level converter shown in FIG. 1 (and at the terminal for the reference potential $V_{ss}$), i.e. at the effective level of the signal), it is advantageous to set the effective level of the first auxiliary signal AS equal to the auxiliary potential UTR provided for controlling the gates of the field-effect transistors T2 to T5, because in this case an immediate evaluation of the level applied to the input E of the external signal, is brought about.

In the MOS-circuit which may be seen from FIG. 1 and corresponds to the description of the invention given above, the following behavior is obtained: A circuit node located between the transistors T7 and T9 as well as a circuit node located between the transistors T8 and T10, is brought symmetrically to the potential $(V_{cc}-U_T)$ by the transistors T11, T13 and T6, and by the transistors T9, T10 and T15, respectively ($U_T$=-threshold voltage). The transistors T1, T2 and T3 together form a differential amplifier which is activated by the first auxiliary signal AS.

The field-effect transistors T4 and T5 serve the purpose of suppressing "bump problems", i.e. disturbances which are due to changes in the first supply potential $V_{cc}$ and therefore in the supply voltage. By way of the transistors T3 as well as T1 and T2, respectively, the drains of the transistors T1, T2 and T3 are precharged to the effective level of the first auxiliary signal AS when T1 becomes conducting, and using the choice of this level (which is preferably to be used) to the value of the auxiliary potential UTR, to the value of this auxiliary potential UTR.

Depending on the magnitude of the external signal level present at the signal input E, one side of the differential amplifier T1, T2 and T3 begins to draw current sooner than the other side, so that the source of the field-effect transistor T7 or the source of the field-effect transistor T8, cross-coupled with the transistor T7, is pulled in direction toward the reference potential $V_{ss}$. In order to permit the asymmetrical current drain of the differential amplifier T1, T2 and T3 over an extended period of time, the transistor T15 and the transistor T10, respectively, furnish the required current to the differential amplifier. The magnitude of this current is reduced by the cross-coupled field-effect transistors T7 and T8 which act as current switches, on the side of the differential amplifier T1, T2, T3 which is to be pulled toward the reference potential $V_{ss}$, depending on the external control signal present at the input E.

Before the third auxiliary signal AP sets in, the nodes at the source terminals of the transistors T7 and T8 cause asymmetry at the signal outputs A1 and A2, through the flip-flops T16 and T17 as well as T18 and T19, respectively. This causes an asymmetry at the gates of the transistors T20 and T21 as well as at the signal outputs A1 and A2. The positive (rising) flank or side of the third auxiliary signal AP affects the signal output A1, on one hand, because the source terminals of the transistors T7 and T8, are at different potentials due to the asymmetry in the behavior of the differential amplifier T1, T2, T3. Accordingly, the state of charge at the signal outputs A1 and A2 which are each connected with the source terminal of the transistors T7 and T8 through an RS flip-flop T16/T17 and T18/T19, respectively, is reduced to different degrees. On the other hand, the positive flank or side of the third auxiliary signal AP affects the signal inputs A1 and A2, respectively, since the gate voltage of transistors T20 and T21 is set in different degrees due to the asymmetry of the differential amplifier T1, T2, T3 and therefore at the cross-coupled transistors T7 and T8. Because of the boot-strap effect of the field-effect transistors T20 and T21, the state of charge of one of the two signal outputs A1 and A2 is pulled to the potential of the third auxiliary signal AP, while the potential of the other signal output is brought to the zero level, i.e. to reference potential $V_{ss}$. Through the flip-flops T16/T17 and T18/T19, the source terminal of the transistor T7 or T8 is pulled to a level which is practically at reference potential $V_{ss}$.

In the system according to the invention, the reduction of the time interval between the set-in of an external control pulse at the signal input E and the secondary pulse appearing at the output A1 and A2 in reply to this control pulse, is due in particular to the fact that in this system, as compared to conventional signal-level converters, a smaller amount of auxiliary signals causing the delay is necessary. In addition, the signal-level converter according to the invention has more favorable properties with respect to overshooting or undershooting in the control signals applied to the signal input, so that greater resistance to interference in the operation of the digital MOS-circuit which is controlled by the signal-level converter and is advantageously monolithically combined with the level converter, is obtained.

The supplemental circuit shown in FIG. 3 for the signal-level converter according to the invention, contains the two field-effect transistors t1 and t2 which are operated as source followers. If the signal-level converter according to the invention is used as an address buffer in an integrated MOS-RAM memory circuit, the supplementary circuit furnishes the address bit required for the corresponding internal input of the address decoder. Each of the inputs of the address decoder is then addressed by one respective level converter according to the invention.

The flip-flop t3/t4 provided in the supplemental circuit according to FIG. 3 serves for storing the address if the level of the third auxiliary signal AP is lowered to the value of the second supply potential $V_{ss}$. The transistors t5 and t6 serve the purpose of killing the charge states at the signal outputs AU1 and AU2 of the supplemental part after a storage cycle is completed. The activating fourth auxiliary signal DV provided for the two transistors t5 and t6 for this purpose, is advantageously the signal which is made available by the memory for terminating the respective addressing process for resetting the address.

Supplementing the explanations given thus far, it should be stated once more that the field-effect transistors used in the circuits According to FIGS. 1 and 3 are of the same type and in particular, are MOS-FETs of the enhancement type. In the interest of providing higher switching speeds, n-channel transistors will be used in most cases.

FIG. 4 shows an MOS-circuit for the clock generator TG which serves for generating the auxiliary signals AS, AK and AP and which, as already mentioned, contains the voltage divider R1, R2 which serves for generating the auxiliary potential UTR. On one hand, the clock generator TG is acted upon by the supply voltage defined by the two supply potentials $V_{cc}$ and $V_{ss}$ while, on the other hand, two pulse sequences E and V are provided. The pulses of the sequence V serve as pre-charging pulses and the pulses E, which are applied to the signal input E+, serve as control pulses. Accordingly, the clock control pulses and the pre-charging pulses V, respectively, assigned thereto, are matched to each other in the usual manner in such a way that the individual pulses each appear in the pause between two immediately succeeding control pulses E+.

In the clock generator TG, a series circuit of three MOS-field-effect transistors a, b and c is first of all connected to the supply voltage of the system. The first field-effect transistor a which is connected directly to the first supply potential $V_{cc}$, has a gate which is addressed by the pre-charging pulses V; the gate of the second field-effect transistor b is addressed by the auxiliary potential UTR; and the third field-effect transistor c which is directly connected to the reference potential $V_{ss}$, has a gate that is addressed by the control pulses E. A circuit point between the middle one of these field-effect transistors, i.e. the second transistor b, and the third field-effect transistor c connected to the reference potential $V_{ss}$, then furnishes the first auxiliary signal AS.

The voltage divider R1 and R2 which was already mentioned in connection with the auxiliary potential UTR, is connected at one end thereof to the first supply potential $V_{cc}$ (i.e. the transistor R1 is connected as a resistor). At the other end thereof, the voltage divider R1 and R2 is connected to the reference potential $V_{ss}$ (i.e. the transistor R2 is connected as a resistor). The tap point between the two transistors R1 and R2 furnishe the auxiliary potential UTR. Preferably, the two transistors R1 and R2 of the voltage divider are identical, so that the auxiliary potential UTR is centered between the two supply potentials $V_{cc}$ and $V_{ss}$.

Figure 4A:
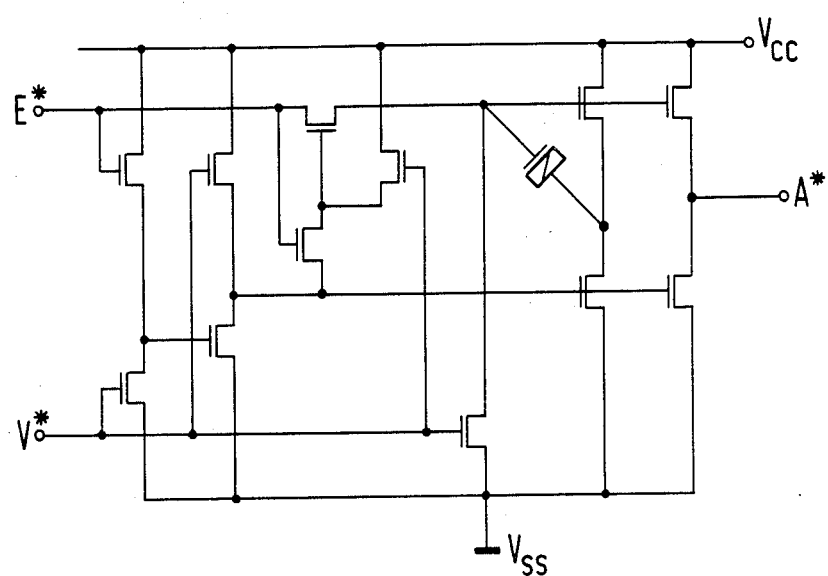
FIG. 4a is a circuit diagram showing circuit parts of FIG. 4 in detail.

The system provided for the clock generator TG shown in FIG. 4 further includes three identical circuit parts SG1, SG2 and SG3, as is shown in detail in FIG. 4a. Since this is a conventional circuit (see the IEEE Journal of Solid-State Circuits, Vol. SC-15, No. 5, October 1980, Page 844, FIG. 11b), further discussion of the circuit can be dispensed with. These three circuit parts SG1, SG2 and SG3 each have an input E*, an input V* and a signal output A*.

The first of these identical circuit parts, i.e. the circuit part SG1, is addressed at its input E* by the pre-charging pulses V, and at its input V* by the control pulses E+ for the clock generator TG. Meanwhile, the output A* of the circuit part SG1 provides the second sequence AK of auxiliary signals. For this purpose, this output A* is additionally connected to the reference potential $V_{ss}$ through the source-drain path of a fourth field-effect transistor d which is addressed at its gate by the control pulses E+ for the clock generator TG. The field-effect transistor d therefore acts as a charge killer.

The second and third identical circuit parts, i.e. the circuit part SG2 and the circuit part SG3, serve for generating the third auxiliary signal AP. For this purpose, the input E* of the circuit part SG2 is addressed by the control pulse E+ for the clock generator TG, while the other input, i.e. the input V* of this circuit part SG2, is addressed by the pre-charging pulses V. The output A* of the circuit part SG2 is connected to the input E* of the third circuit part SG3, the other input V* of which is controlled by the control signals E+ for the clock generator TG. The output A* of this third circuit part SG3 then furnishes the third auxiliary signal AP.

The field-effect transistors used in the circuit according to FIGS. 4 and 4a, respectively, are advantageously of the same type as the other transistors used in the circuit. They are therefore predominantly of the n-channel type and are self-blocking. The resistors R1 and R2 of the voltage divider may optionally be of the self-conducting type. However, in the interest of simplifying the manufacture of the device, in many cases only transistors of the same type, i.e. of the self-blocking type, are chosen.

It should further be noted that it is possible without difficulty to generate the auxiliary signals required for the operation of the pulse-level converter according to the invention in a manner other than with a circuit according to FIGS. 4 and 4a.

The foregoing is a description corresponding in substance to German Application No. P 32 25 803.8, dated July 9, 1982, the International priority of which is being claimed for the instant application, and which is hereby made part of this application. Any material discrepancies between the foregoing specification and the aforementioned corresponding German application are to be resolved in favor of the latter.

We claim:

1. Signal-lever converter circuit for controlling digital MOS circuits, comprising a first supply potential source, a second supply potential source delivering a reference potential, an auxiliary potential source delivering an auxiliary potential lying between said first and second supply potentials, a common clock generator having first, second and third outputs delivering first, second and third auxiliary signals, respectively, first and second converter signal outputs carrying signals being inverted relative to each other for controlling the digital circuit, a signal input for receiving a digital control signal to be processed, and first through twenty-first field-effect transistors each having a gate terminal and current-carrying terminals in the form of a source terminal and a drain terminal defining a source-drain path, said signal input being connected to said gate terminal of said first transistor, said source terminals of said first and second transistors being connected together to said drain terminal of said third transistor, said source terminal of said third transistor being connected to said first output of said clock generator, said drain terminal of said first transistor being connected through said fourth transistor to one of said current-carrying terminals of said sixth transistor, said drain terminal of said second transistor being connected through said fifth transistor to the other of said current-carrying terminals of said sixth transistor, said one current-carrying terminal of said sixth transistor also being connected to said source terminal of said seventh transistor and to said gate terminal of said eighth transistor, said other current-carrying terminal of said sixth transistor also being connected to said source terminal of said eighth transistor and to said gate terminal of said seventh transistor, said ninth and tenth transistors being connected together in series between said drain terminal of said seventh transistor and said drain terminal of said eighth transistor, said source-drain paths of said eleventh and twelfth transistors being connected together in parallel between said source terminal of said seventh transistor and said first supply potential source, said source-drain paths of said thirteenth and fourteenth transistors being connected together in parallel between said source terminal of said eighth transistor and said first supply potential source, said gate terminal of said eleventh transistor being connected to said drain terminal of said seventh transistor, said gate terminal of said thirteenth transistor being connected to said drain terminal of said eighth transistor, said ninth and tenth series-connected transistors defining a circuit node therebetween connected through said fifteenth transistor to said first supply potential source, said gate terminals of said fifteenth, sixth, ninth, tenth, twelfth and fourteenth transistors being jointly connected to said second output of said clock generator, said gate terminals of said second, third, fourth and fifth transistors being jointly connected to said auxiliary potential source, said sixteenth and seventeenth transistors having cross connected drain and gate terminals forming a first RS flip-flop, said eighteenth and nineteenth transistors having cross connected drain and gate terminals forming a second RS flip-flop, said source terminals of said sixteenth, seventeenth, eighteenth and nineteenth transistors being connected to said second supply potential source, said drain terminal of said sixteenth transistor being connected to said source terminal of said seventh transistor, said drain terminal of said eighteenth transistor being connected to said source terminal of said eighth transistor, said drain terminal of said seventeenth transistor being connected to said source terminal of said twentieth transistor, said drain terminal of said nineteenth transistor being connected to said source terminal of said twenty-first transistor, said gate terminal of said twentieth transistor being connected to said drain terminal of said eighth transistor, said gate terminal of said twenty-first transistor being connected to said drain terminal of said seventh transistor, said drain terminals of said twentieth and twenty-first transistors being connected to said third output of said clock generator, said auxiliary signals delivered by said clock generator being matched to each other in such a manner that the effective level of said first and second auxiliary signals are given substantially simultaneously and the effective level of said second auxiliary signal is set higher than the effective level of said first auxiliary signal, said third auxiliary signal being at substantially the same effective level as said second auxiliary signal and being reached immediately upon the occurence of decay of said first auxiliary signal, said first, second and third auxiliary signals having a zero state given by said reference potential delivered by said second supply potential source, said source terminal of said twentieth transistor being connected to said first converter signal output, and said source terminal of said twenty-first transistor being connected to said second converter signal output.

2. Circuit according to claim 1, wherein all of said field-effect transistors are of the same type.

3. Circuit according to claim 1, wherein all of said field-effect transistors are of the n-channel enhancement type.

4. Circuit according to claim 1, including another field-effect transistor having a gate terminal connected to said first converter signal output, a drain terminal connected to said first supply potential source, and a source terminal, a further field-effect transistor having a gate terminal connected to said second converter signal output, a drain terminal connected to said first supply potential source, and a source terminal, a third RS flip-flop being connected to said second supply potential source and having one output connected to said source terminal of said other field-effect transistor and another output connected to said source terminal of said further field-effect transistor, a first address buffer signal output connected to said source terminal of said other field-effect transistor, a second address buffer signal output connected to said source terminal of said further field-effect transistor, two discharge transistors each being connected between a respective one of said ouputs of said third RS flip-flop and said second supply potential source, said discharge transistors having gate terminals, and a fourth auxiliary signal output connected to said gate terminals of said discharge transistors.

5. Circuit according to claim 4, wherein all of said field-effect transistors are of the same type.

6. Circuit according to claim 4, wherein all of said field-effect transistors are of the n-channel enhancement type.

* * * * *